US012381591B2

United States Patent
Uejima et al.

(10) Patent No.: US 12,381,591 B2
(45) Date of Patent: Aug. 5, 2025

(54) RADIO-FREQUENCY MODULE AND COMMUNICATION APPARATUS

(71) Applicant: Murata Manufacturing Co., Ltd., Kyoto (JP)

(72) Inventors: Takanori Uejima, Kyoto (JP); Hiromichi Kitajima, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 413 days.

(21) Appl. No.: 18/163,320

(22) Filed: Feb. 2, 2023

(65) Prior Publication Data

US 2023/0179248 A1 Jun. 8, 2023

Related U.S. Application Data

(63) Continuation of application No. PCT/JP2021/032657, filed on Sep. 6, 2021.

(30) Foreign Application Priority Data

Sep. 24, 2020 (JP) ................ 2020-160216

(51) Int. Cl.
*H04B 1/38* (2015.01)
*H03F 3/24* (2006.01)
(Continued)

(52) U.S. Cl.
CPC ............. *H04B 1/38* (2013.01); *H03F 3/245* (2013.01); *H03F 2200/294* (2013.01); *H03F 2200/451* (2013.01)

(58) Field of Classification Search
None
See application file for complete search history.

(56) References Cited

U.S. PATENT DOCUMENTS 7,102,896 B2 * 9/2006 Ajioka ............... H01L 23/552
257/E23.114
8,767,859 B2 * 7/2014 Fukamachi ......... H01P 1/20336
375/267
(Continued)

FOREIGN PATENT DOCUMENTS

JP 2007-294965 A 11/2007
JP 2011-187677 A 9/2011
(Continued)

OTHER PUBLICATIONS

International Search Report for PCT/JP2021/032657 dated Dec. 7, 2021.

*Primary Examiner* — Pablo N Tran
(74) *Attorney, Agent, or Firm* — McDonald Hopkins LLC

(57) ABSTRACT

A radio-frequency module includes: a module substrate having major faces; a first circuit component disposed over the major face; a second circuit component disposed over the major face: external connection terminals disposed over the major face; and a metal shield plate extending perpendicularly from the major face and set to a ground potential. The external connection terminals include a first external connection terminal and a second external connection terminal, the first external connection terminal being an external connection terminal through which a first radio-frequency signal is inputted or outputted, the second external connection terminal being an external connection terminal through which one of a power supply signal, a control signal, and a second radio-frequency signal is inputted or outputted. The metal shield plate has a recess in an end portion.

20 Claims, 4 Drawing Sheets

(51) Int. Cl.
*H04B 1/00* (2006.01)
*H04B 1/04* (2006.01)

(56) References Cited

U.S. PATENT DOCUMENTS

| | | | |
|---|---|---|---|
| 10,511,268 B2* | 12/2019 | Kim | H01L 23/66 |
| 11,638,346 B2* | 4/2023 | Kang | H01L 23/3128 |
| | | | 361/782 |
| 11,664,839 B2* | 5/2023 | Pehlivanoglu | H04L 5/14 |
| | | | 370/329 |
| 11,804,816 B2* | 10/2023 | Ayranci | H04B 1/0053 |
| 11,881,876 B2* | 1/2024 | Yamaguchi | H04B 1/525 |
| 11,901,307 B2* | 2/2024 | Chuang | H01L 23/3128 |
| 11,968,815 B2* | 4/2024 | Nomura | H01L 25/16 |
| 11,990,968 B2* | 5/2024 | Chen | H04B 7/068 |
| 12,107,616 B2* | 10/2024 | Nakazawa | H03F 3/245 |
| 12,107,619 B2* | 10/2024 | Khlat | H04L 5/14 |
| 2007/0246825 A1 | 10/2007 | Oh et al. | |
| 2012/0320559 A1* | 12/2012 | Kimura | H01L 23/552 |
| | | | 361/818 |
| 2013/0043946 A1 | 2/2013 | Hadjichristos et al. | |
| 2015/0119102 A1 | 4/2015 | Saji et al. | |
| 2020/0251459 A1 | 8/2020 | Tsuda et al. | |
| 2020/0343151 A1 | 10/2020 | Nomura et al. | |

FOREIGN PATENT DOCUMENTS

| | | |
|---|---|---|
| JP | 2014-522216 A | 8/2014 |
| JP | 2015-111803 A | 6/2015 |
| JP | 2020-126921 A | 8/2020 |
| WO | 2019/138895 A1 | 7/2019 |

* cited by examiner

RADIO-FREQUENCY MODULE AND COMMUNICATION APPARATUS

CROSS REFERENCE TO RELATED APPLICATION

This is a continuation of International Application No. PCT/JP2021/032657 filed on Sep. 6, 2021 which claims priority from Japanese Patent Application No. 2020-160216 filed on Sep. 24, 2020. The contents of these applications are incorporated herein by reference in their entireties.

BACKGROUND OF THE DISCLOSURE

Field of the Disclosure

The present disclosure relates to a radio-frequency module, and a communication apparatus.

Description of the Related Art

As mobile communication apparatuses such as mobile phones are becoming, in particular, increasingly multiband, the arrangement and configuration of circuit elements constituting the radio-frequency front-end circuit of such apparatuses are becoming increasingly complex.

Patent Document 1 discloses a circuit configuration of a transceiver (transmit and receive circuit) including the following components: a plurality of transmitters (transmit paths): a plurality of receivers (receive paths); and a switchplexer (antenna switch) disposed between an antenna, and the transmitters and the receivers. Each of the transmitters includes a transmit circuit, a transmit power amplifier (PA), and an output circuit. Each of the receivers includes a receive circuit, a receive low-noise amplifier (LNA), and an input circuit. The output circuit includes components such as a transmit filter, an impedance matching circuit, and a duplexer. The input circuit includes components such as a receive filter, an impedance matching circuit, and a duplexer. The above-mentioned configuration allows simultaneous transmission, simultaneous reception, or simultaneous transmission and reception to be executed through the switching action of the switchplexer.

Patent Document 1: Japanese Unexamined Patent Application Publication (Translation of PCT Application) No. 2014-522216

BRIEF SUMMARY OF THE DISCLOSURE

One potential issue with implementing the transceiver (transmit and receive circuit) disclosed in Patent Document 1 by a radio-frequency module incorporated in a mobile communication apparatus would be that electromagnetic coupling may occur between at least two of a plurality of circuit components and a plurality of connection terminals that are disposed in each of the transmit path, the receive path, and the transmit and receive path including the antenna switch. In this case, the harmonic wave components of the transmit signal at high output power that has been amplified in the transmit power amplifier (PA) may become superposed on the transmit signal, leading to potential deterioration in the quality of the transmit signal. The electromagnetic coupling may also lead to the reduced isolation between the transmit and receive sides. As a result, the harmonic waves mentioned above, or spurious waves such as intermodulation distortion between the transmit signal and another radio-frequency signal may leak into the receive path, leading to the potential deterioration of the reception sensitivity. The above-mentioned electromagnetic coupling may also result in the interference between two receive signals, and consequently the deterioration of the reception sensitivity.

The present disclosure has been made to address the above-mentioned problems. Accordingly, it is a possible benefit of the present disclosure to provide a radio-frequency module and a communication apparatus that allow for the reduced deterioration in the quality of a transmit signal or a receive signal.

A radio-frequency module according to an aspect of the present disclosure includes: a module substrate having a first major face and a second major face that are opposite to each other; a first circuit component disposed over the first major face; a second circuit component disposed over the second major face; a plurality of external connection terminals disposed over the second major face; and a metal shield plate disposed over the second major face and extending in a direction perpendicular to the second major face, the metal shield plate being set to a ground potential. The plurality of external connection terminals include a first external connection terminal and a second external connection terminal, the first external connection terminal being an external connection terminal through which a first radio-frequency signal is inputted or outputted, the second external connection terminal being an external connection terminal through which one of a power supply signal, a control signal, and a second radio-frequency signal is inputted or outputted. The metal shield plate has a recess in at least one of end portions that are opposite to each other in the direction perpendicular to the second major face. With the module substrate seen in plan view, the metal shield plate is disposed between the first external connection terminal and the second external connection terminal, or between the second external connection terminal and the second circuit component.

The present disclosure makes it possible to provide a radio-frequency module and a communication apparatus that allow for the reduced deterioration in the quality of a transmit signal or a receive signal.

DETAILED DESCRIPTION OF THE DISCLOSURE

Figure 1:
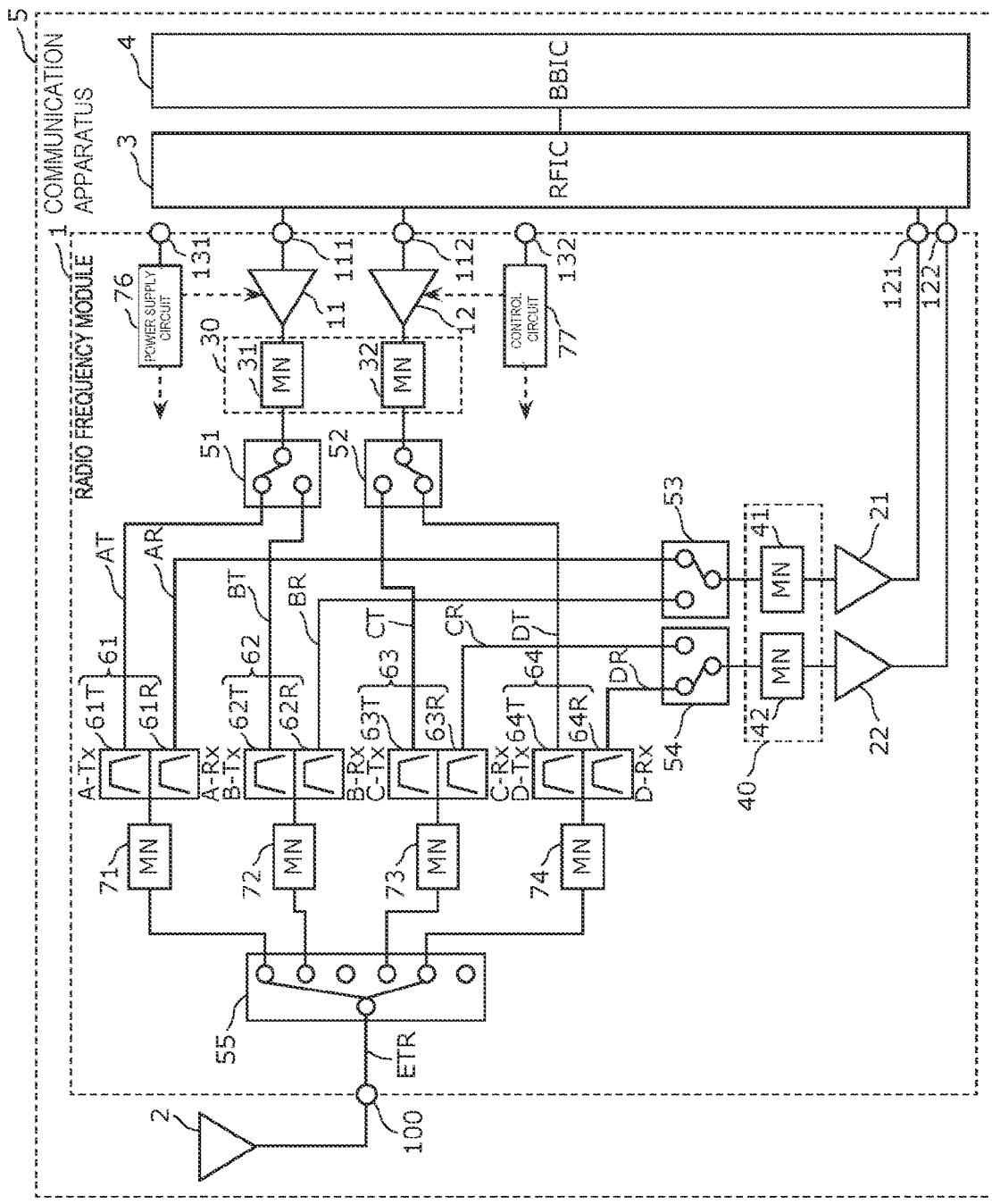
FIG. 1 illustrates the circuit configurations of a radio-frequency module and a communication apparatus according to an embodiment.

Embodiments of the present disclosure will be described below in detail. The embodiments described below represent generic or specific examples. Features presented in the following description of embodiments, inventive examples, and modifications, such as numerical values, shapes, materials, components, and the arrangement and connection of components, are illustrative only and not intended to be limiting of the present disclosure. Of the components presented in the following description of embodiments and inventive examples, those components not described in independent claims will be described as optional components. The sizes of components illustrated in the drawings or the ratios between the sizes of these components are not necessarily drawn to scale. Throughout the drawings, identical reference signs are used to designate substantially identical features, and repetitive description will be sometimes omitted or simplified.

In the following description, "parallel", "perpendicular", or other such terms indicative of the relationship between elements, "rectangular" or other such terms indicative of a shape of an element, and numerical ranges are not intended to represent only their strict meanings but are meant to also include their substantial equivalents, for example, equivalents with deviations of about a few percent.

In the figures below, an x-axis and a y-axis are mutually orthogonal axes in a plane parallel to the major face of a module substrate. A z-axis is an axis perpendicular to the major face of the module substrate. The z-axis has a positive direction defined as an upward direction, and a negative direction defined as a downward direction.

As used in the following description of the circuit configuration according to the present disclosure, the term "connected" means not only that circuit elements are directly connected with each other by a connection terminal or a wiring conductor but also that circuit elements are electrically connected with each other with another circuit element interposed therebetween. The expression "connected between A and B" means being located between A and B and connected with both A and B.

As used in the following description of the module configuration according to the present disclosure, expressions such as "in plan view" mean an orthographic projection of an object onto an xy-plane from the positive side of the z-axis. Expressions such as "a component is disposed over or in a major face of a substrate" include not only that the component is disposed on top of the major face of the substrate in contact with the major face, but also that the component is disposed above the major face without contact with the major face, and that the component is disposed with a portion thereof partially embedded into the substrate from the major face. Expressions such as "A is connected between B and C" mean that at least one of line segments connecting between a given point in B and a given point in C passes through A. Further, "parallel", "perpendicular", or other such terms indicative of the relationship between elements, and "rectangular" or other such terms indicative of a shape of an element are not intended to represent only their strict meanings but are meant to also include their substantial equivalents, for example, equivalents with deviations or differences of about a few percent.

As used in the following description, the term "transmit path" means a transfer line including, for example, wiring for transferring a radio-frequency transmit signal, an electrode directly connected with the wiring, and a terminal directly connected with the wiring or the electrode. The term "receive path" means a transfer line including, for example, wiring for transferring a radio-frequency receive signal, an electrode directly connected with the wiring, and a terminal directly connected with the wiring or the electrode. The term "transmit and receive path" means a transfer line including, for example, wiring for transferring a radio-frequency transmit signal and a radio-frequency receive signal, an electrode directly connected with the wiring, and a terminal directly connected with the wiring or the electrode.

Embodiment

[Circuit Configurations of Radio-Frequency Module 1 and Communication Apparatus 5]

FIG. 1 illustrates the circuit configurations of a radio-frequency module 1 and a communication apparatus 5 according to an embodiment. As illustrated in FIG. 1, the communication apparatus 5 includes the radio-frequency module 1, an antenna 2, a radio-frequency integrated circuit (RFIC) 3, and a baseband integrated circuit (BBIC) 4.

The RFIC 3 represents a circuit that processes radio-frequency signals transmitted and received by the antenna 2. Specifically, the RFIC 3 applies signal processing such as down-conversion to a radio-frequency receive signal inputted via a receive signal path of the radio-frequency module 1, and outputs the processed receive signal to the BBIC 4. The RFIC 3 also applies signal processing such as up-conversion to a transmit signal inputted from the BBIC 4, and outputs the processed radio-frequency transmit signal to a transmit signal path of the radio-frequency module 1.

The BBIC 4 is a circuit that processes a signal by using a band of intermediate frequencies lower than the frequencies of radio-frequency signals that propagate in the radio-frequency module 1. The signal processed by the BBIC 4 is used as, for example, a video signal for image display, or as an audio signal for telephone conversation using a speaker.

The RFIC 3 also serves as a controller that, based on the communication band (frequency band) to be used, controls the connections of switches 51, 52, 53, 54, and 55 included in the radio-frequency module 1. Specifically, the RFIC 3 switches the connections of the switches 51 to 55 of the radio-frequency module 1 by means of a control signal (not illustrated). The controller may be provided outside the RFIC 3, for example, in the radio-frequency module 1 or the BBIC 4.

The antenna 2 is connected with an antenna connection terminal 100 of the radio-frequency module 1. The antenna 2 radiates a radio-frequency signal outputted from the radio-frequency module 1. The antenna 2 also receives an extraneous radio-frequency signal, and outputs the received radio-frequency signal to the radio-frequency module 1.

The communication apparatus 5 according to the embodiment is not necessarily required to include the antenna 2 and the BBIC 4.

Reference is now made to a detailed configuration of the radio-frequency module 1.

As illustrated in FIG. 1, the radio-frequency module 1 includes the following components: power amplifiers 11 and 12, low-noise amplifiers 21 and 22, transmit filters 61T, 62T, 63T and 64T, receive filters 61R, 62R, 63R, and 64R, an output matching circuit 30, an input matching circuit 40, matching circuits 71, 72, 73 and 74, the switches 51, 52, 53, 54, and 55, a power supply circuit 76, and a control circuit 77.

The antenna connection terminal 100 is connected with the antenna 2.

The power amplifier 11 is a first power amplifier that amplifies radio-frequency signals in a communication band A (first communication band) and a communication band B, which are communication bands belonging to a first frequency band group. The power amplifier 11 has an input terminal that is connected with a transmit input terminal 111, and an output terminal that is connected with a matching circuit 31. The power amplifier 12 is a second power amplifier that amplifies radio-frequency signals in a communication band C (second communication band) and a communication band D, which are communication bands belonging to a second frequency band group lower than the first frequency band group. The power amplifier 12 has an input terminal that is connected with a transmit input terminal 112, and an output terminal that is connected with a matching circuit 32.

The low-noise amplifier 21 is a first low-noise amplifier that provides low-noise amplification of radio-frequency signals in the communication band A and the communication band B. The low-noise amplifier 21 has an input terminal that is connected with a matching circuit 41, and an output terminal that is connected with a receive output terminal 121. The low-noise amplifier 22 is a second low-noise amplifier that provides low-noise amplification of radio-frequency signals in the communication band C and the communication band D. The low-noise amplifier 22 has an input terminal that is connected with a matching circuit 42, and an output terminal that is connected with a receive output terminal 122.

The transmit filter 61T is disposed in a transmit path AT that connects the power amplifier 11 with the switch 55. The transmit filter 61T is capable of passing, from among transmit signals amplified in the power amplifier 11, a transmit signal in a transmit band that coincides with the communication band A. The transmit filter 62T is disposed in a transmit path BT that connects the power amplifier 11 with the switch 55. The transmit filter 62T is capable of passing, from among transmit signals amplified in the power amplifier 11, a transmit signal in a transmit band that coincides with the communication band B. The transmit filter 63T is disposed in a transmit path CT that connects the power amplifier 12 with the switch 55. The transmit filter 63T is capable of passing, from among transmit signals amplified in the power amplifier 12, a transmit signal in a transmit band that coincides with the communication band C. The transmit filter 64T is disposed in a transmit path DT that connects the power amplifier 12 with the switch 55. The transmit filter 64T is capable of passing, from among transmit signals amplified in the power amplifier 12, a transmit signal in a transmit band that coincides with the communication band D.

The receive filter 61R is disposed in a receive path AR that connects the low-noise amplifier 21 with the switch 55. The receive filter 61R is capable of passing, from among receive signals inputted from the antenna connection terminal 100, a receive signal in a receive band that coincides with the communication band A. The receive filter 62R is disposed in a receive path BR that connects the low-noise amplifier 21 with the switch 55. The receive filter 62R is capable of passing, from among receive signals inputted from the antenna connection terminal 100, a receive signal in a receive band that coincides with the communication band B. The receive filter 63R is disposed in a receive path CR that connects the low-noise amplifier 22 with the switch 55. The receive filter 63R is capable of passing, from among receive signals inputted from the antenna connection terminal 100, a receive signal in a receive band that coincides with the communication band C. The receive filter 64R is disposed in a receive path DR that connects the low-noise amplifier 22 and the switch 55. The receive filter 64R is capable of passing, from among receive signals inputted from the antenna connection terminal 100, a receive signal in a receive band that coincides with the communication band D.

Non-limiting suitable examples of the transmit filters 61T to 64T and the receive filters 61R to 64R may include: surface acoustic wave filters; acoustic wave filters employing bulk acoustic waves (BAWs); LC resonant filters; and dielectric filters.

The transmit filter 61T and the receive filter 61R constitute a duplexer 61 with a pass band that coincides with the communication band A. The transmit filter 62T and the receive filter 62R constitute a duplexer 62 with a pass band that coincides with the communication band B. The transmit filter 63T and the receive filter 63R constitute a duplexer 63 with a pass band that coincides with the communication band C. The transmit filter 64T and the receive filter 64R constitute a duplexer 64 with a pass band that coincides with the communication band D.

The output matching circuit 30 includes the matching circuits 31 and 32. The matching circuit 31 is disposed in the transmit path that connects the power amplifier 11 with each of the transmit filters 61T and 62T. The matching circuit 31 performs impedance matching between the power amplifier 11 and each of the transmit filters 61T and 62T. The matching circuit 32 is disposed in the transmit path that connects the power amplifier 12 with each of the transmit filters 63T and 64T. The matching circuit 32 performs impedance matching between the power amplifier 12 and each of the transmit filters 63T and 64T.

The input matching circuit 40 includes the matching circuits 41 and 42. The matching circuit 41 is disposed in the receive path that connects the low-noise amplifier 21 with each of the receive filters 61R and 62R. The matching circuit 41 performs impedance matching between the low-noise amplifier 21 and each of the receive filters 61R and 62R. The matching circuit 42 is disposed in the receive path that connects the low-noise amplifier 22 with each of the receive filters 63R and 64R. The matching circuit 42 performs impedance matching between the low-noise amplifier 22 and each of the receive filters 63R and 64R.

The switch 51 is disposed in the transmit path that connects the matching circuit 31 with each of the transmit filters 61T and 62T. The switch 51 switches whether to connect the power amplifier 11 with the transmit filter 61T, and whether to connect the power amplifier 11 with the transmit filter 62T. The switch 52 is disposed in the transmit path that connects the matching circuit 32 with each of the transmit filters 63T and 64T. The switch 52 switches whether to connect the power amplifier 12 with the transmit filter 63T, and whether to connect the power amplifier 12 with the transmit filter 64T. The switch 53 is disposed in the receive path that connects the matching circuit 41 with each of the receive filters 61R and 62R. The switch 53 switches whether to connect the low-noise amplifier 21 with the receive filter 61R, and whether to connect the low-noise amplifier 21 with the receive filter 62R. The switch 54 is disposed in the receive path that connects the matching circuit 42 with each of the receive filters 63R and 64R. The switch 54 switches whether to connect the low-noise amplifier 22 with the receive filter 63R, and whether to connect the low-noise amplifier 22 with the receive filter 64R.

The switch 55 is a first switch disposed in the signal path that connects the antenna connection terminal 100 with the following filters: the transmit filters 61T to 64T, and the receive filters 61R to 64R. The switch 55 switches (1) whether to connect the antenna connection terminal 100 with the transmit filter 61T and the receive filter 61R, (2) whether to connect the antenna connection terminal 100 with the transmit filter 62T and the receive filter 62R, (3) whether to connect the antenna connection terminal 100 with the transmit filter 63T and the receive filter 63R, and (4) whether to connect the antenna connection terminal 100 with the transmit filter 64T and the receive filter 64R. The switch 55 is implemented as a multi-connection switching circuit capable of simultaneously establishing two or more of the connections mentioned in the items (1) to (4) above.

The matching circuit 71 is disposed in the path that connects the switch 55 with each of the transmit filter 61T and the receive filter 61R. The matching circuit 71 performs impedance matching between the antenna 2 and the switch 55, and the transmit filter 61T and the receive filter 61R. The matching circuit 72 is disposed in the path that connects the switch 55 with each of the transmit filter 62T and the receive filter 62R. The matching circuit 72 performs impedance matching between the antenna 2 and the switch 55, and the transmit filter 62T and the receive filter 62R. The matching circuit 73 is disposed in the path that connects the switch 55 with each of the transmit filter 63T and the receive filter 63R. The matching circuit 73 performs impedance matching between the antenna 2 and the switch 55, and the transmit filter 63T and the receive filter 63R. The matching circuit 74 is disposed in the path that connects the switch 55 with each of the transmit filter 64T and the receive filter 64R. The matching circuit 74 performs impedance matching between the antenna 2 and the switch 55, and the transmit filter 64T and the receive filter 64R.

The radio-frequency module according to the present disclosure is not necessarily required to include the matching circuits 71 to 74. Instead of the matching circuits 71 to 74, a matching circuit may be disposed in a transmit and receive path ETR that connects the antenna connection terminal 100 with the switch 55.

The power supply circuit 76 is connected with a power supply terminal 131. The power supply circuit 76 receives supply of electric power via the power supply terminal 131 from a power supply (not illustrated), and outputs a power supply signal to at least one of the following components: the switches 51 to 55, the power amplifiers 11 and 12, and the low-noise amplifiers 21 and 22. The power supply circuit 76 may output a power supply signal to another electronic component.

A power supply signal refers to a signal for supplying electric power to an electronic component included in the radio-frequency module 1. For example, a power supply signal is a signal for supplying a power supply voltage and/or a bias current to the power amplifiers 11 and 12. A power supply signal may be, for example, a signal for supplying drive electric power to the switches 51 to 55.

The control circuit 77 is connected with a control terminal 132. The control circuit 77 receives a control signal via the control terminal 132 from the RFIC 3, and outputs the control signal to at least one of the following components: the switches 51 to 55, the power amplifiers 11 and 12, and the low-noise amplifiers 21 and 22. The control circuit 77 may output the control signal to another electronic component.

A control signal refers to a signal for controlling an electronic component included in the radio-frequency module 1. Specifically, a control signal is, for example, a digital control signal for controlling at least one of the following components: the power amplifiers 11 and 12, the low-noise amplifiers 21 and 22, and the switches 51 to 55.

In the radio-frequency module 1 with the circuit configuration mentioned above, the power amplifier 11, the matching circuit 31, the switch 51, and the transmit filters 61T and 62T constitute a first transmit circuit that outputs transmit signals in the communication band A and the communication band B toward the antenna connection terminal 100. The power amplifier 12, the matching circuit 32, the switch 52, and the transmit filters 63T and 64T constitute a second transmit circuit that outputs transmit signals in the communication band C and the communication band D toward the antenna connection terminal 100. The first transmit circuit and the second transmit circuit constitute a transmit circuit that outputs transmit signals in the communication bands A to D toward the antenna connection terminal 100.

The low-noise amplifier 21, the matching circuit 41, the switch 53, and the receive filters 61R and 62R constitute a first receive circuit that receives receive signals in the communication band A and the communication band B from the antenna 2 via the antenna connection terminal 100. The low-noise amplifier 22, the matching circuit 42, the switch 54, and the receive filters 63R and 64R constitute a second receive circuit that receives receive signals in the communication band C and the communication band D from the antenna 2 via the antenna connection terminal 100. The first receive circuit and the second receive circuit constitute a receive circuit that receives receive signals in the communication bands A to D from the antenna connection terminal 100.

The second transmit circuit and the second receive circuit are, for example, circuits that respectively transfer a transmit signal and a receive signal that are in communication bands belonging to a low-band group. The low-band group is a frequency band group including a plurality of communication bands that support 4G and 5G. For example, the low-band group has a range of frequencies less than or equal to 1 GHz.

The first transmit circuit and the first receive circuit are, for example, circuits that respectively transfer a transmit signal and a receive signal that are in communication bands belonging to a middle-band group. The middle-band group is a frequency band group including a plurality of communication bands that support 4G and 5G. The middle-band group is higher in frequency than the low-band group, and has, for example, a range of frequencies from 1.5 to 2.2 GHz.

The first transmit circuit and the first receive circuit may be, for example, circuits that respectively transfer a transmit signal and a receive signal that are in communication bands belonging to a high-band group. The high-band group is a frequency band group including a plurality of communication bands that support 4G and 5G. The high-band group is higher in frequency than the middle-band group, and has, for example, a range of frequencies from 2.4 to 2.8 GHz.

The circuit configuration mentioned above allows the radio-frequency module 1 according to the embodiment to execute at least one of simultaneous transmission, simultaneous reception, and simultaneous transmission and reception of a radio-frequency signal in one of the communication band A and the communication band B, and a radio-frequency signal in one of the communication band C and the communication band D.

In the radio-frequency module according to the present disclosure, each of the transmit circuit and the receive circuit does not have to be connected with the antenna connection terminal 100 with the switch 55 interposed therebetween. Alternatively, each of the transmit circuit and the receive circuit may be connected with the antenna 2 with a different terminal interposed therebetween. The radio-frequency module according to the present disclosure may simply include at least one of the first transmit circuit, the second transmit circuit, the first receive circuit, and the second receive circuit.

One potential issue with the radio-frequency module 1 having the circuit configuration mentioned above is that if electromagnetic coupling occurs between at least two of a plurality of circuit components and a plurality of connection terminals that are disposed in the transmit path, the receive path, and the transmit and receive path, harmonic wave components of the transmit signal at high output power that has been amplified in the power amplifier may become superposed on the transmit signal, leading to the deterioration in the quality of the transmit signal. Another potential issue is that the above-mentioned electromagnetic coupling may result in the reduced isolation between the transmit and receive sides. As a result, the above-mentioned harmonic waves, or spurious waves such as intermodulation distortion between a transmit signal and another radio-frequency signal may leak into the receive path, leading to the deterioration of reception sensitivity. Another potential issue is that the above-mentioned electromagnetic coupling may result in the interference between two receive signals, which may lead to the deterioration of the reception sensitivity.

To address these issues, the radio-frequency module 1 according to the embodiment is designed to have a configuration to reduce the above-mentioned electromagnetic coupling. Reference is now made to how the radio-frequency module 1 according to the embodiment is configured to reduce the above-mentioned electromagnetic coupling.

[Arrangement of Circuit Components of Radio-Frequency Module 1A according to Inventive Example]

Figure 2A:
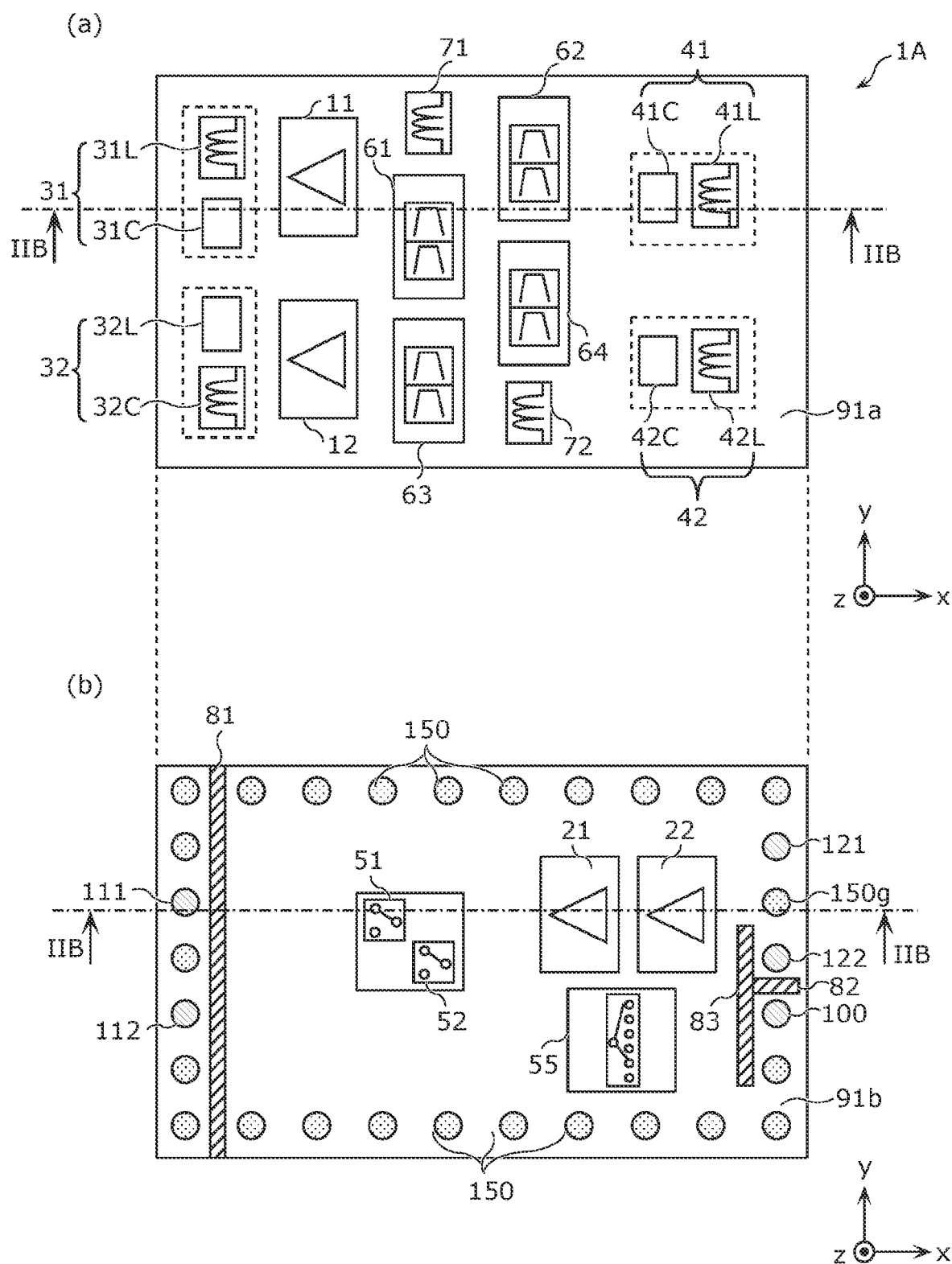
FIG. 2A is a plan view of a radio-frequency module according to an inventive example.
Figure 2B:
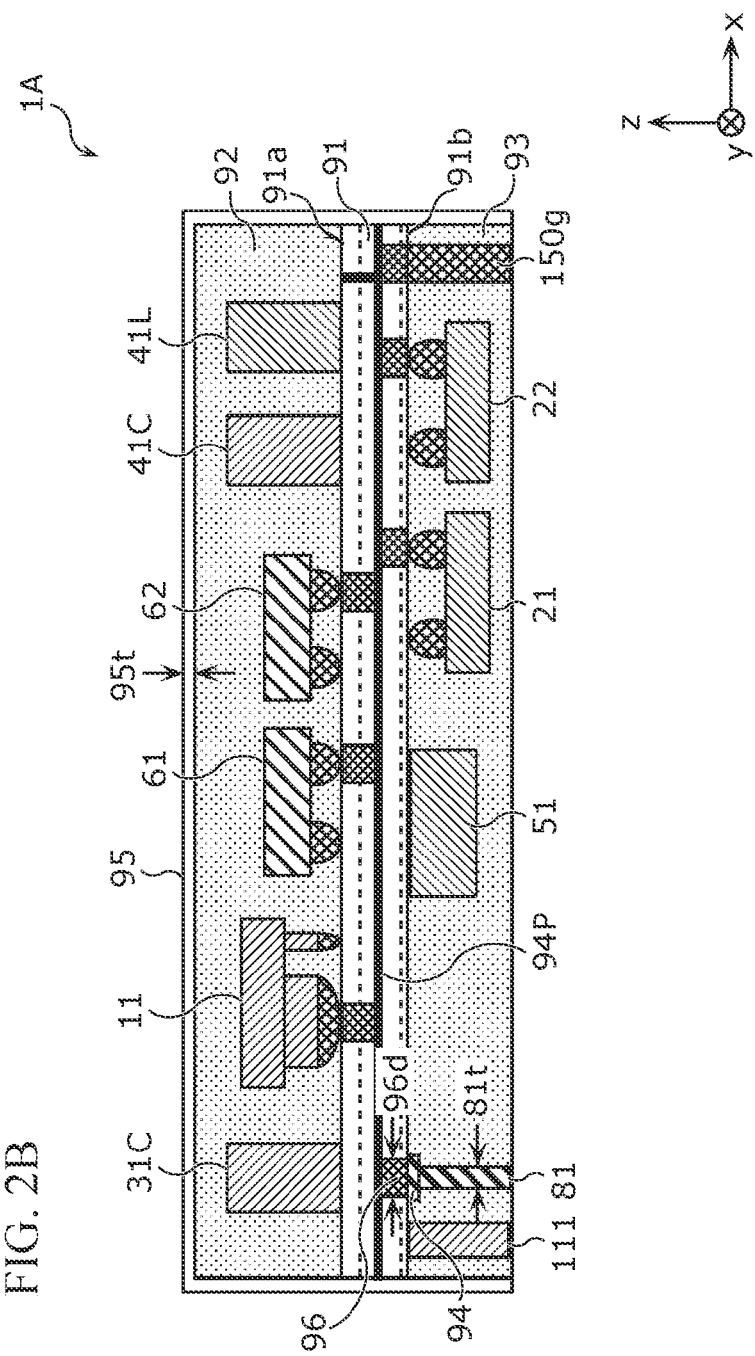
FIG. 2B is a cross-sectional view of the radio-frequency module according to the inventive example.

FIG. 2A is a schematic plan view of a radio-frequency module 1A according to an inventive example. FIG. 2B is a schematic cross-sectional view of the radio-frequency module 1A according to the inventive example. Specifically, FIG. 2B illustrates a cross-section taken along a line IIB-IIB in FIG. 2A. Part (a) of FIG. 2A illustrates an arrangement of circuit elements with a major face 91a viewed from the positive side in the direction of the z-axis, the major face 91a being one of opposite major faces 91a and 91b of a module substrate 91. Part (b) of FIG. 2A is a see-through illustration of an arrangement of circuit elements with the major face 91b viewed from the positive side in the direction of the z-axis.

The radio-frequency module 1A according to the inventive example represents a specific arrangement of circuit components of the radio-frequency module 1 according to the embodiment.

As illustrated in FIGS. 2A and 2B, the radio-frequency module 1A according to the inventive example further includes the following components in addition to the circuit components illustrated in FIG. 1: the module substrate 91, metal shield plates 81, 82, and 83, a metal shield layer 95, a via-conductor 96, resin components 92 and 93, and a plurality of external connection terminals 150.

The module substrate 91 is a substate having the major face 91a over which the first and second transmit circuits and the first and second receive circuits are to be mounted. Non-limiting examples of the module substrate 91 include the following substrates with a multilayer structure of a plurality of dielectric layers; low temperature co-fired ceramic (LTCC) substrates; high temperature co-fired ceramic (HTCC) substrates; substrates with embedded components; substrates with a redistribution layer (RDL); and printed circuit boards. The antenna connection terminal 100, the transmit input terminals 111 and 112, and the receive output terminals 121 and 122 may be provided over the module substrate 91.

The resin component 92 is disposed over the major face 91a of the module substrate 91. The resin component 92 covers at least part of circuit components constituting the first and second transmit circuits, at least part of circuit components constituting the first and second receive circuits, and the major face 91a. The resin component 92 serves to ensure the reliability of the above-mentioned circuit components, such as mechanical strength and moisture resistance. The resin component 93 is disposed over the major face 91b of the module substrate 91. The resin component 93 covers at least part of circuit components constituting the first and second transmit circuits, at least part of circuit components constituting the first and second receive circuits, and the major face 91b. The resin component 93 serves to ensure the reliability of the above-mentioned circuit components, such as mechanical strength and moisture resistance.

Each of the matching circuits 31, 32, 41, 42, 71 and 72 includes an inductor, and/or a capacitor. In FIG. 2A, each of the matching circuits 31, 32, 41, and 42 includes both an inductor and a capacitor. Each of the matching circuits 71 and 72 includes an inductor but no capacitor. The matching circuits 31, 32, 41, 42, 71 and 72 are not necessarily configured as described above. For example, each of the matching circuits 31, 32, 41, and 42 may include no capacitor, and each of the matching circuits 71 and 72 may include a capacitor.

The external connection terminals 150 are disposed over the major face 91b of the module substrate 91. The radio-frequency module 1A exchanges electrical signals through the external connection terminals 150 with an external substrate that is located on the negative side in the direction of the z-axis relative to the radio-frequency module 1A. As illustrated in part (b) of FIG. 2A, the external connection terminals 150 include the antenna connection terminal 100, the transmit input terminals 111 and 112, and the receive output terminals 121 and 122. Although not illustrated, the power supply terminal 131 and the control terminal 132 may be also included in the external connection terminals 150. Among the external connection terminals 150, a ground terminal 150g is a ground terminal set to the ground potential of the external substrate. The ground terminal 150g may be connected with a ground conductor pattern 94P disposed inside the module substrate 91. The external connection terminals 150 may be flat electrodes disposed over the major face 91b as illustrated in FIG. 2B, or may be bump electrodes disposed over the major face 91b. If the external connection terminals 150 are bump electrodes, no resin component 93 may be provided.

Although not illustrated in FIG. 2A, pieces of wiring constituting the transmit paths, the receive paths, and the transmit and receive path, which are paths connecting between the circuit components illustrated in FIG. 1, are disposed inside the module substrate 91 and over the major faces 91a and 91b. Each piece of wiring may be a bonding wire that is joined at opposite ends to the major face 91a or 91b and one of circuit elements constituting the radio-frequency module 1A, or may be a terminal, an electrode, or a piece of wiring that is disposed over or on the surface of a circuit component constituting the radio-frequency module 1A.

The metal shield layer 95 covers the surface of the resin component 92, and is set to the ground potential. The metal shield layer 95 is, for example, a metallic thin film formed by sputtering. The metal shield layer 95 may be connected with the ground conductor pattern 94P at a lateral face of the module substrate 91.

The via-conductor 96 is disposed inside the module substrate 91, and extends in a direction that crosses the major face 91b. The via-conductor 96 is set to the ground potential of the radio-frequency module 1A. According to the inventive example, the via-conductor 96 extends in a direction orthogonal to the major face 91b.

Each of the metal shield plates 81, 82, and 83 is a metal wall that extends from the major face 91b toward a top face of the resin component 93 (i.e., in a direction perpendicular to the major face 91b) located on the negative side in the direction of the z-axis. Each of the metal shield plates 81, 82, and 83 is connected at the major face 91b with the via-conductor 96. Each of the metal shield plates 81, 82, and 83, and the via-conductor 96 may be in direct contact with each other, or may be, as illustrated in FIG. 2B, connected with each other with a ground electrode 94 interposed therebetween, the ground electrode 94 being disposed over the major face 91b.

According to the configuration mentioned above, each of the metal shield plates 81 to 83 is connected with the via-conductor 96 that is set to the ground potential. This allows for enhanced electromagnetic shielding function. A detailed structure of each of the metal shield plates 81 to 83 will be described later with reference to FIGS. 3A to 3C.

As illustrated in FIGS. 2A and 2B, in the radio-frequency module 1A according to the inventive example, the power amplifiers 11 and 12, the duplexers 61 to 64, and the matching circuits 31, 32, 41, 42, 71 and 72 each represent an example of a first circuit component, and are disposed over the major face 91a (first major face). The low-noise amplifiers 21 and 22, and the switches 51, 52, and 55 each represent an example of a second circuit component, and are disposed over the major face 91b (second major face).

The switches 53 and 54, the matching circuits 73 and 74, the power supply circuit 76, and the control circuit 77, which are not illustrated in FIGS. 2A and 2B, may be disposed over any one of the major faces 91a and 91b, or may be disposed in the module substrate 91.

In the radio-frequency module 1A according to the inventive example, with the module substrate 91 seen in plan view, the metal shield plate 81 is disposed between the transmit input terminals 111 and 112, and at least one second circuit component disposed over the major face 91b. In this case, the transmit input terminals 111 and 112 each represent an example of a second external connection terminal through which a second radio-frequency signal is inputted or outputted. Specifically, the transmit input terminals 111 and 112 each represent the external connection terminal 150 through which a transmit signal is inputted.

The above-mentioned configuration helps to reduce the electromagnetic coupling between the transmit input terminals 111 and 112 through which a transmit signal at high output power is transferred, and the second circuit component. This therefore helps to reduce the strong signal interference at the major face 91b between transmit signals, or between a transmit signal and a receive signal. This in turn allows for the precise reduction of the deterioration in the quality of a transmit signal or a receive signal.

With the module substrate 91 seen in plan view, the metal shield plate 81 is disposed between the transmit input terminals 111 and 112, and the receive output terminals 121 and 122. In this case, the transmit input terminals 111 and 112 each represent an example of a second external connection terminal through which a second radio-frequency signal is inputted or outputted. Specifically, the transmit input terminals 111 and 112 each represent the external connection terminal 150 through which a transmit signal is inputted. The receive output terminals 121 and 122 each represent an example of a first external connection terminal through which a first radio-frequency signal is inputted or outputted. Specifically, the receive output terminals 121 and 122 each represent the external connection terminal 150 through which a receive signal is output.

The above-mentioned configuration helps to reduce the electromagnetic coupling between the transmit input terminals 111 and 112 through which a transmit signal at high output power is transferred, and the receive output terminals 121 and 122 through which a receive signal is transferred. This therefore helps to reduce the strong signal interference at the major face 91b between a transmit signal and a receive signal. This in turn allows for the precise reduction of the deterioration in the quality of a receive signal.

With the module substrate 91 seen in plan view, the metal shield plate 81 is disposed between the transmit input terminals 111 and 112, and the antenna connection terminal 100. In this case, the transmit input terminals 111 and 112 each represent an example of a second external connection terminal through which a second radio-frequency signal is inputted or outputted. The antenna connection terminal 100 represents an example of a first external connection terminal through which a first radio-frequency signal is inputted or outputted. Specifically, the antenna connection terminal 100 represents the external connection terminal 150 through which a transmit signal and a receive signal are transferred.

The above-mentioned configuration helps to reduce the electromagnetic coupling between the transmit input terminals 111 and 112 through which a transmit signal at high output power is transferred, and the antenna connection terminal 100 through which a transmit signal and a receive signal are transferred. This therefore helps to reduce the strong signal interference at the major face 91b between transmit signals, or between a transmit signal and a receive signal. This in turn allows for the precise reduction of the deterioration in the quality of a transmit signal or a receive signal.

Although not illustrated in part (b) of FIG. 2A, if at least one of the power supply terminal 131 and the control terminal 132 is disposed over the major face 91b, the metal shield plate 81 may be disposed, with the module substrate 91 seen in plan view, between the at least one of the power supply terminal 131 and the control terminal 132, and at least one of the following terminals: the transmit input terminals 111 and 112, the receive output terminals 121 and 122, and the antenna connection terminal 100. In this case, the transmit input terminals 111 and 112, the receive output terminals 121 and 122, and the antenna connection terminal 100 each represent an example of a first external connection terminal through which a first radio-frequency signal is inputted or outputted. The power supply terminal 131 is a second external connection terminal through which a power supply signal is inputted or outputted, and the control terminal 132 is a second external connection terminal through which a control signal is inputted or outputted.

The above-mentioned configuration helps to reduce the strong signal interference between at least one of a transmit signal and a receive signal, and at least one of the power supply signal and the control signal. This in turn allows for the precise reduction of the deterioration in the quality of a transmit signal or a receive signal.

In the radio-frequency module 1A according to the inventive example, with the module substrate 91 seen in plan view, the metal shield plate 82 is disposed between the antenna connection terminal 100 and the receive output terminal 122. In this case, the receive output terminal 122 represents an example of a first external connection terminal through which a first radio-frequency signal is inputted or outputted. The antenna connection terminal 100 represents an example of a second external connection terminal through which a second radio-frequency signal is inputted or outputted.

The above-mentioned configuration helps to reduce the electromagnetic coupling between the receive output terminal 122 through which a receive signal is transferred, and the antenna connection terminal 100 through which a transmit signal and a receive signal are transferred. This therefore helps to reduce the strong signal interference at the major face 91*b* between receive signals, or between a receive signal and a transmit signal. This in turn allows for the precise reduction of the deterioration in the quality of a receive signal.

In the radio-frequency module 1A according to the inventive example, with the module substrate 91 seen in plan view, the metal shield plate 83 is disposed between the receive output terminal 122 and the antenna connection terminal 100, and a second circuit component disposed over the major face 91*b*. In this case, the receive output terminal 122 and the antenna connection terminal 100 each represent an example of a second external connection terminal through which a second radio-frequency signal is inputted or outputted.

The above-mentioned configuration helps to reduce the electromagnetic coupling between the receive output terminal 122 and the antenna connection terminal 100, and the second circuit component. This therefore helps to reduce the strong signal interference at the major face 91*b* between receive signals, or between a transmit signal and a receive signal. This in turn allows for the precise reduction of the deterioration in the quality of a transmit signal or a receive signal.

In the radio-frequency module 1A according to the inventive example, the via-conductor 96 has an outside diameter 96*d* greater than or equal to a thickness 81*t* of the metal shield plate 81. If the outside diameter 96*d* of the via-conductor 96 is less than the thickness 81*t* of the metal shield plate 81, it is not possible to set the potential of the metal shield plate 81 strongly to the ground of the radio-frequency module 1A. The configuration according to the present example, by contrast, makes it possible to improve the ground of the metal shield plate 81. This results in the ability to reduce the strong signal interference between external connection terminals, or between an external connection terminal and a second circuit component. This in turn allows for the precise reduction of the deterioration in the quality of a transmit signal or a receive signal.

In the radio-frequency module 1A according to the inventive example, the thickness 81*t* of the metal shield plate 81 is greater than a thickness 95*t* of the metal shield layer 95. This makes it possible to enhance, relative to the capability to shield against extraneous noise, the capability to reduce the leakage of the noise generated in a circuit component of the radio-frequency module 1A into another circuit component of the radio-frequency module 1A.

The outside diameter 96*d* of the via-conductor 96 may be greater than or equal to a thickness of the metal shield plate 82, or may be greater than or equal to a thickness of the metal shield plate 83.

The thickness of the metal shield plate 82 may be greater than the thickness 95*t* of the metal shield layer 95. The thickness of the metal shield plate 83 may be greater than the thickness 95*t* of the metal shield layer 95.

It is desirable that the metal shield plates 81 to 83 have a height from the major face 91*b* that is greater than or equal to the height of the external connection terminals 150 from the major face 91*b*.

The above-mentioned configuration helps to effectively reduce the signal interference between external connection terminals positioned across the one of metal shield plates 81 to 83 from each other, or between an external connection terminal and a second circuit component.

The radio-frequency module 1A according to the inventive example may simply include, as a first circuit component disposed over the major face 91*a*, at least one of the following components: the power amplifiers 11 and 12, the duplexers 61 to 64, the matching circuits 31, 32, 41, 42, and 71 to 74, the low-noise amplifiers 21 and 22, the switches 51 to 55, the power supply circuit 76, and the control circuit 77. The radio-frequency module 1A according to the inventive example may simply include, as a second circuit component disposed over the major face 91*b*, at least one of the following components: the power amplifiers 11 and 12, the duplexers 61 to 64, the matching circuits 31, 32, 41, 42, and 71 to 74, the low-noise amplifiers 21 and 22, the switches 51 to 55, the power supply circuit 76, and the control circuit 77.

At least two of the low-noise amplifiers 21 and 22, and the switches 53 to 55 may be included in a single semiconductor IC. This allows for the reduced area of the major face 91*b*, and also reduced profile.

[Structure of Metal Shield Plate]

Reference is now made to the structure of each of the metal shield plates 81 to 83 included in the radio-frequency module 1A according to the inventive example.

Figure 3A:
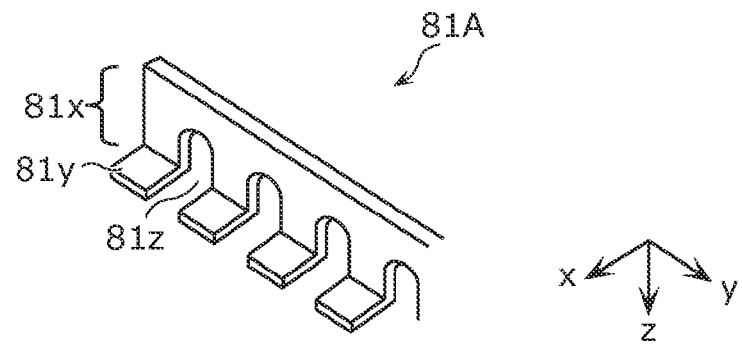
FIG. 3A is a perspective exterior view of a first example of a metal shield plate.

FIG. 3A is a perspective exterior view of a metal shield plate 81A. The metal shield plate 81A illustrated in FIG. 3A is an example of the metal shield plate 81 according to the inventive example. The metal shield plate 81A extends perpendicularly from the major face 91*b* (not illustrated) toward the top face of the resin component 93 (not illustrated) (i.e., in the negative direction of the z-axis). Of opposite end portions of the metal shield plate 81A in a direction perpendicular to the module substrate 91 (i.e., in the direction of the z-axis), the end portion in contact with the major face 91*b* has a recess 81*z*. Of the opposite end portions of the metal shield plate 81A in the direction perpendicular to the module substrate 91 (i.e., in the direction of the z-axis), the end portion not in contact with the major face 91*b* may also have such a recess.

The metal shield plate 81A includes a body part 81*x*, and a joint part 81*y*. The body part 81*x* extends perpendicularly from the major face 91*b* toward the top face of the resin component 93 (i.e., in the negative direction of the z-axis). The joint part 81*y* extends in parallel to the major face 91*b*, and is joined with a ground electrode (not illustrated) disposed over the major face 91*b*.

With the structure of the metal shield plate 81A mentioned above, the presence of the recess 81*z* between the body part 81*x* and the major face 91*b* helps to ensure, in forming the resin component 93 over the major face 91*b*, good flowability of liquid resin in the vicinity of the metal shield plate 81A. This in turn helps to reduce the occurrence, in the vicinity of the metal shield plate 81A, of voids or other areas where no resin component 93 is present. Further, as described above, the metal shield plate 81A and the major face 91*b* are joined with each other by means of the joint part 81*y*. This improves the accuracy of the placement of the metal shield plate 81A, and the strength of the joining between the metal shield plate 81A and the major face 91*b*.

Figure 3B:
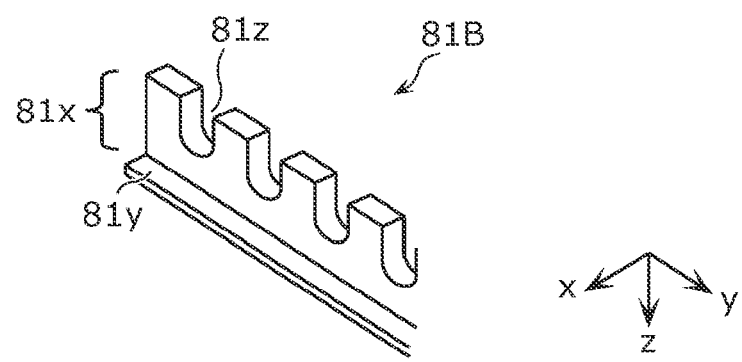
FIG. 3B is a perspective exterior view of a second example of the metal shield plate.

FIG. 3B is a perspective exterior view of a metal shield plate 81B. The metal shield plate 81B illustrated in FIG. 3B is an example of the metal shield plate 81 according to the inventive example. The metal shield plate 81B extends perpendicularly from the major face 91b (not illustrated) toward the top face of the resin component 93 (not illustrated) (i.e., in the negative direction of the z-axis). Of opposite end portions of the metal shield plate 81B in a direction perpendicular to the module substrate 91 (i.e., in the direction of the z-axis), the end portion not in contact with the major face 91b has a recess 81z. Of the opposite end portions of the metal shield plate 81B in the direction perpendicular to the module substrate 91 (i.e., in the direction of the z-axis), the end portion in contact with the major face 91b may also have such a recess.

The metal shield plate 81B includes a body part 81x, and a joint part 81y. The body part 81x extends perpendicularly from the major face 91b toward the top face of the resin component 93 (i.e., in the negative direction of the z-axis). The joint part 81y extends in parallel to the major face 91b, and is joined with a ground electrode (not illustrated) disposed over the major face 91b.

With the structure of the metal shield plate 81B mentioned above, the presence of the recess 81z between the body part 81x and the top face helps to ensure, in forming the resin component 93 over the major face 91b, good flowability of liquid resin in the vicinity of the metal shield plate 81B. This in turn helps to reduce the occurrence, in the vicinity of the metal shield plate 81B, of voids or other areas where no resin component 93 is present. Further, as described above, the metal shield plate 81B and the major face 91b are joined with each other by means of the joint part 81y. This improves the accuracy of the placement of the metal shield plate 81B, and the strength of the joining between the metal shield plate 81B and the major face 91b.

Figure 3C:
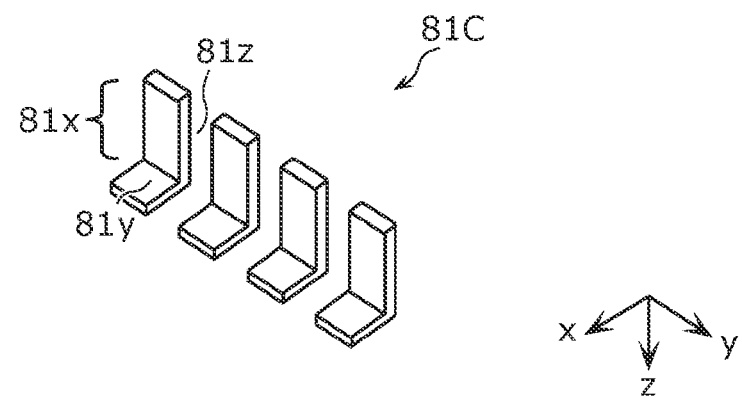
FIG. 3C is a perspective exterior view of a third example of the metal shield plate.

FIG. 3C is a perspective exterior view of a metal shield plate 81C. The metal shield plate 81C illustrated in FIG. 3C is an example of the metal shield plate 81 according to the inventive example. The metal shield plate 81C extends perpendicularly from the major face 91b (not illustrated) toward the top face of the resin component 93 (not illustrated) (i.e., in the negative direction of the z-axis). Opposite end portions of the metal shield plate 81C in a direction perpendicular to the module substrate 91 (i.e., in the direction of the z-axis) have a recess 81z.

The metal shield plate 81C includes a plurality of body parts 81x, and a plurality of joint parts 81y. The body parts 81x extend perpendicularly from the major face 91b toward the top face of the resin component 93 (i.e., in the negative direction of the z-axis). The joint parts 81y extend in parallel to the major face 91b, and are joined with a ground electrode (not illustrated) disposed over the major face 91b. In the metal shield plate 81C, the body parts 81x are disposed discretely with the recess 81z interposed between adjacent body parts 81x, and the joint parts 81y are disposed discretely with the recess 81z interposed between adjacent joint parts 81y.

With the structure of the metal shield plate 81C mentioned above, the presence of the recess 81z between the major face 91b and the top face helps to ensure, in forming the resin component 93 over the major face 91b, good flowability of liquid resin in the vicinity of the metal shield plate 81C. This in turn helps to reduce the occurrence, in the vicinity of the metal shield plate 81C, of voids or other areas where no resin component 93 is present. Further, as described above, the metal shield plate 81C and the major face 91b are joined with each other by means of the joint parts 81y. This improves the accuracy of the placement of the metal shield plate 81C, and the strength of the joining between the metal shield plate 81C and the major face 91b.

Exemplary configurations of the metal shield plate 81 are not limited to those of the metal shield plates 81A to 81C mentioned above. The joint part 81y does not necessarily extend in the positive direction of the x-axis as illustrated in FIGS. 3A to 3C, but may extend in the negative direction of the x-axis. Further, the metal shield plate 81 may include both the joint part 81y that extends in the positive direction of the x-axis and the joint part 81y that extends in the negative direction of the x-axis.

Each of the metal shield plates 82 and 83 may be similar in structure to the metal shield plates 81A to 81C.

Advantageous Effects Etc

As described above, a radio-frequency module 1A according to the inventive example includes: a module substrate 91 having a major face 91a and a major face 91b that are opposite to each other; a first circuit component disposed over the major face 91a; a second circuit component disposed over the major face 91b; a plurality of external connection terminals 150 disposed over the major face 91b; and one of metal shield plates 81 to 83 disposed over the major face 91b and extending in a direction perpendicular to the major face 91b, the one of metal shield plates 81 to 83 being set to a ground potential. The plurality of external connection terminals 150 include a first external connection terminal and a second external connection terminal, the first external connection terminal being an external connection terminal through which a first radio-frequency signal is inputted or outputted, the second external connection terminal being an external connection terminal through which one of a power supply signal, a control signal, and a second radio-frequency signal is inputted or outputted. The one of metal shield plates 81 to 83 has a recess 81z in at least one of end portions that are opposite to each other in the direction perpendicular to the major face 91b. With the module substrate 91 seen in plan view, the one of metal shield plates 81 to 83 is disposed between the first external connection terminal and the second external connection terminal, or between the second external connection terminal and the second circuit component.

The above-mentioned configuration helps to reduce the electromagnetic coupling between the first radio-frequency signal and the second radio-frequency signal, or the electromagnetic coupling between the second circuit component, and one of the power supply signal, the control signal, and the second radio-frequency signal. This results in the ability to reduce the strong signal interference at the major face 91b between transmit signals, between receive signals, between a transmit signal and a receive signal, and between a radio-frequency signal and the power supply signal or the control signal. This in turn allows for the precise reduction of the deterioration in the quality of a transmit signal or a receive signal. The presence of the recess 81z in the one of metal shield plates 81 to 83 helps to ensure, in forming the resin component 93 over the major face 91b, good flowability of liquid resin in the vicinity of the one of metal shield plates 81 to 83. This in turn helps to reduce the occurrence, in the vicinity of the one of metal shield plates 81 to 83, of voids or other areas where no resin component 93 is present.

The radio-frequency module 1A may be configured such that: the radio-frequency module 1A further includes a via-conductor 96 disposed inside the module substrate 91, the via-conductor 96 extending in a direction that crosses the major face 91b, the via-conductor 96 being set to a ground potential; the metal shield plate 81 is connected at the major face 91b with the via-conductor 96; and the via-conductor 96 has an outside diameter greater than or equal to a thickness of the metal shield plate 81.

The above-mentioned configuration helps to improve the ground of the metal shield plate 81. This results in the ability to reduce the strong signal interference between external connection terminals, or between an external connection terminal and a second circuit component. This in turn allows for the precise reduction of the deterioration in the quality of a transmit signal or a receive signal.

The radio-frequency module 1A may be configured such that: the metal shield plate 81 includes a body part 81x extending in the direction perpendicular to the major face 91b, and a joint part 81y extending in parallel to the major face 91b, the joint part 81y being connected at the major face 91b with the via-conductor 96.

According to the above-mentioned configuration, the metal shield plate 81 and the major face 91b are joined with each other by means of the joint part 81y. This improves the accuracy of the placement of the metal shield plate 81, and the strength of the joining between the metal shield plate 81 and the major face 91b.

The radio-frequency module 1A may be configured such that: the radio-frequency module 1A further includes a resin component 92 that covers the major face 91a, and at least part of the first circuit component, and a metal shield layer 95 that covers a surface of the resin component 92, the metal shield layer 95 being set to a ground potential; and the metal shield plate 81 is thicker than the metal shield layer 95.

The above-mentioned configuration makes it possible to enhance, relative to the capability to shield against extraneous noise, the capability to reduce the leakage of the noise generated in a circuit component of the radio-frequency module 1A into another circuit component of the radio-frequency module 1A.

The radio-frequency module 1A may be configured such that: the metal shield plate 81 has a height from the major face 91b that is greater than or equal to a height of the external connection terminals 150 from the major face 91b.

The above-mentioned configuration helps to effectively reduce the signal interference between the external connection terminals 150 positioned across the metal shield plate 81 from each other, or between the external connection terminals 150 and the second circuit component.

The radio-frequency module 1A may be configured such that: the first circuit component is a power amplifier 11; the second circuit component is a low-noise amplifier 21; the second external connection terminal is a transmit input terminal 111 connected with an input terminal of the power amplifier 11; and with the module substrate 91 seen in plan view, the metal shield plate 81 is disposed between the transmit input terminal 111 and the second circuit component.

The above-mentioned configuration helps to reduce the electromagnetic coupling between a transmit signal and a receive signal. This therefore helps to reduce the strong signal interference at the major face 91b between a transmit signal and a receive signal. This in turn allows for the precise reduction of the deterioration in the quality of a receive signal.

The radio-frequency module 1A may be configured such that: the first circuit component is a power amplifier 11; the second circuit component is a low-noise amplifier 21; the radio-frequency module 1A further includes an antenna connection terminal 100, and a switch 55 that switches whether to connect the antenna connection terminal 100 and the power amplifier 11 with each other, and switches whether to connect the antenna connection terminal 100 and the low-noise amplifier 21 with each other; the first external connection terminal is the antenna connection terminal 100; the second external connection terminal is a transmit input terminal 111 or a receive output terminal 121, the transmit input terminal 111 being connected with an input terminal of the power amplifier 11, the receive output terminal 121 being connected with an output terminal of the low-noise amplifier 21; and with the module substrate 91 seen in plan view, the metal shield plate 83 is disposed between the antenna connection terminal 100 and the transmit input terminal 111, or the metal shield plate 82 is disposed between the antenna connection terminal 100 and the receive output terminal 121.

The above-mentioned configuration helps to reduce the electromagnetic coupling between a transmit signal and a receive signal. This therefore helps to reduce the strong signal interference at the major face 91b between a transmit signal and a receive signal. This in turn allows for the precise reduction of the deterioration in the quality of a receive signal.

A communication apparatus 5 includes: an RFIC 3 that processes a radio-frequency signal transmitted and received by an antenna 2; and the radio-frequency module 1 that transfers the radio-frequency signal between the antenna 2 and the RFIC 3.

The above-mentioned configuration makes it possible to provide the communication apparatus 5 with the reduced deterioration in the quality of a transmit signal or a receive signal.

OTHER EMBODIMENTS, ETC

Although the radio-frequency module and the communication apparatus according to the present disclosure have been described above by way of an embodiment, an inventive example, and a modification, the radio-frequency module and the communication apparatus according to the present disclosure are not limited to the embodiment, the inventive example, and the modification described above. The present disclosure is intended to encompass other embodiments implemented by combining any components in the embodiment, the inventive example, and the modification mentioned above, modifications obtained by modifying the embodiment, the inventive example, and the modification mentioned above in various ways as may become apparent to one skilled in the art without departing from the scope of the present disclosure, and various kinds of equipment incorporating the radio-frequency module and the communication apparatus.

For example, in the radio-frequency module and the communication apparatus according to the embodiment, the inventive example, and the modification mentioned above, other circuit elements, wiring, and other features may be inserted between paths that connect the circuit elements and the signal paths that are illustrated in the drawings.

The present disclosure is applicable to a wide variety of communication apparatuses such as mobile phones, as a radio-frequency module disposed in a multiband-compatible front-end part of such communication apparatuses.

1, 1A radio-frequency module
2 antenna
3 radio-frequency integrated circuit (RFIC)
4 baseband integrated circuit (BBIC)
5 communication apparatus 11, 12 power amplifier
21, 22 low-noise amplifier
30 output matching circuit
31, 32, 41, 42, 71, 72, 73, 74 matching circuit
31C, 32C, 41C, 42C capacitor
31L, 32L, 41L, 42L inductor
40 input matching circuit
51, 52, 53, 54, 55 switch
61, 62, 63, 64 duplexer
61R, 62R, 63R, 64R receive filter
61T, 62T, 63T, 64T transmit filter
76 power supply circuit
77 control circuit
81, 81A, 81B, 81C, 82, 83 metal shield plate
81t, 95t thickness
81x body part
81y joint part
81z recess
91 module substrate
91a, 91b major face
92, 93 resin component
94 ground electrode
94P ground conductor pattern
95 metal shield layer
96 via-conductor
96d outside diameter
100 antenna connection terminal
111, 112 transmit input terminal
121, 122 receive output terminal
131 power supply terminal
132 control terminal
150 external connection terminal
150g ground terminal
AR, BR, CR, DR receive path
AT, BT, CT, DT transmit path
ETR transmit and receive path

The invention claimed is:

1. A radio-frequency module comprising:
a module substrate having a first major face and a second major face, the first major face and the second major face being opposite to each other;
a first circuit component disposed over the first major face;
a second circuit component disposed over the second major face;
a plurality of external connection terminals disposed over the second major face; and
a metal shield plate disposed over the second major face and extending in a direction perpendicular to the second major face, the metal shield plate being set to a ground potential,
wherein the plurality of external connection terminals include a first external connection terminal and a second external connection terminal, the first external connection terminal being an external connection terminal through which a first radio-frequency signal is inputted or outputted, the second external connection terminal being an external connection terminal through which one of a power supply signal, a control signal, and a second radio-frequency signal is inputted or outputted,
wherein the metal shield plate has a recess in at least one of end portions being opposite to each other in the direction perpendicular to the second major face, and
wherein with the module substrate seen in plan view, the metal shield plate is disposed between the first external connection terminal and the second external connection terminal, or between the second external connection terminal and the second circuit component.

2. The radio-frequency module according to claim 1, further comprising
a via-conductor disposed inside the module substrate, the via-conductor extending in a direction crossing the second major face, the via-conductor being set to a ground potential,
wherein the metal shield plate is connected at the second major face with the via-conductor, and
wherein the via-conductor has an outside diameter greater than or equal to a thickness of the metal shield plate.

3. The radio-frequency module according to claim 2, further comprising:
a resin component covering the first major face, and at least part of the first circuit component; and
a metal shield layer covering a surface of the resin component, the metal shield layer being set to a ground potential,
wherein the metal shield plate is thicker than the metal shield layer.

4. The radio-frequency module according to claim 2,
wherein the metal shield plate has a height from the second major face being greater than or equal to a height of the second external connection terminal from the second major face.

5. The radio-frequency module according to claim 2,
wherein the first circuit component is a power amplifier,
wherein the second circuit component is a low-noise amplifier,
wherein the second external connection terminal is a transmit input terminal connected with an input terminal of the power amplifier, and
wherein with the module substrate seen in plan view, the metal shield plate is disposed between the second external connection terminal and the second circuit component.

6. The radio-frequency module according to claim 2,
wherein the first circuit component is a power amplifier,
wherein the second circuit component is a low-noise amplifier,
wherein the radio-frequency module further comprises
an antenna connection terminal, and
a switch configured to switch whether to connect the antenna connection terminal and the power amplifier with each other, and switch whether to connect the antenna connection terminal and the low-noise amplifier with each other,
wherein the first external connection terminal is the antenna connection terminal,
wherein the second external connection terminal is a transmit input terminal or a receive output terminal, the transmit input terminal being connected with an input terminal of the power amplifier, the receive output terminal being connected with an output terminal of the low-noise amplifier, and
wherein with the module substrate seen in plan view, the metal shield plate is disposed between the first external connection terminal and the second external connection terminal.

7. The radio-frequency module according to claim 2,
wherein the metal shield plate includes
a body part extending in the direction perpendicular to the second major face, and
a joint part extending in parallel to the second major face, the joint part being connected at the second major face with the via-conductor.

8. The radio-frequency module according to claim 7, further comprising:
   a resin component covering the first major face, and at least part of the first circuit component; and
   a metal shield layer covering a surface of the resin component, the metal shield layer being set to a ground potential,
   wherein the metal shield plate is thicker than the metal shield layer.

9. The radio-frequency module according to claim 7, wherein the metal shield plate has a height from the second major face being greater than or equal to a height of the second external connection terminal from the second major face.

10. The radio-frequency module according to claim 7, wherein the first circuit component is a power amplifier, wherein the second circuit component is a low-noise amplifier,
   wherein the second external connection terminal is a transmit input terminal connected with an input terminal of the power amplifier, and
   wherein with the module substrate seen in plan view, the metal shield plate is disposed between the second external connection terminal and the second circuit component.

11. The radio-frequency module according to claim 7, wherein the first circuit component is a power amplifier, wherein the second circuit component is a low-noise amplifier,
   wherein the radio-frequency module further comprises an antenna connection terminal, and
      a switch configured to switch whether to connect the antenna connection terminal and the power amplifier with each other, and switch whether to connect the antenna connection terminal and the low-noise amplifier with each other,
   wherein the first external connection terminal is the antenna connection terminal,
   wherein the second external connection terminal is a transmit input terminal or a receive output terminal, the transmit input terminal being connected with an input terminal of the power amplifier, the receive output terminal being connected with an output terminal of the low-noise amplifier, and
   wherein with the module substrate seen in plan view, the metal shield plate is disposed between the first external connection terminal and the second external connection terminal.

12. The radio-frequency module according to claim 1, further comprising:
   a resin component covering the first major face, and at least part of the first circuit component; and
   a metal shield layer covering a surface of the resin component, the metal shield layer being set to a ground potential,
   wherein the metal shield plate is thicker than the metal shield layer.

13. The radio-frequency module according to claim 12, wherein the metal shield plate has a height from the second major face being greater than or equal to a height of the second external connection terminal from the second major face.

14. The radio-frequency module according to claim 12, wherein the first circuit component is a power amplifier, wherein the second circuit component is a low-noise amplifier,
   wherein the second external connection terminal is a transmit input terminal connected with an input terminal of the power amplifier, and
   wherein with the module substrate seen in plan view, the metal shield plate is disposed between the second external connection terminal and the second circuit component.

15. The radio-frequency module according to claim 12, wherein the first circuit component is a power amplifier, wherein the second circuit component is a low-noise amplifier,
   wherein the radio-frequency module further comprises an antenna connection terminal, and
      a switch configured to switch whether to connect the antenna connection terminal and the power amplifier with each other, and switch whether to connect the antenna connection terminal and the low-noise amplifier with each other,
   wherein the first external connection terminal is the antenna connection terminal,
   wherein the second external connection terminal is a transmit input terminal or a receive output terminal, the transmit input terminal being connected with an input terminal of the power amplifier, the receive output terminal being connected with an output terminal of the low-noise amplifier, and
   wherein with the module substrate seen in plan view, the metal shield plate is disposed between the first external connection terminal and the second external connection terminal.

16. The radio-frequency module according to claim 1, wherein the metal shield plate has a height from the second major face being greater than or equal to a height of the second external connection terminal from the second major face.

17. The radio-frequency module according to claim 16, wherein the first circuit component is a power amplifier, wherein the second circuit component is a low-noise amplifier,
   wherein the second external connection terminal is a transmit input terminal connected with an input terminal of the power amplifier, and
   wherein with the module substrate seen in plan view, the metal shield plate is disposed between the second external connection terminal and the second circuit component.

18. The radio-frequency module according to claim 1, wherein the first circuit component is a power amplifier, wherein the second circuit component is a low-noise amplifier,
   wherein the second external connection terminal is a transmit input terminal connected with an input terminal of the power amplifier, and
   wherein with the module substrate seen in plan view, the metal shield plate is disposed between the second external connection terminal and the second circuit component.

19. The radio-frequency module according to claim 1, wherein the first circuit component is a power amplifier, wherein the second circuit component is a low-noise amplifier,
   wherein the radio-frequency module further comprises an antenna connection terminal, and
      a switch configured to switch whether to connect the antenna connection terminal and the power amplifier with each other, and switch whether to connect the antenna connection terminal and the low-noise amplifier with each other, wherein the first external connection terminal is the antenna connection terminal, wherein the second external connection terminal is a transmit input terminal or a receive output terminal, the transmit input terminal being connected with an input terminal of the power amplifier, the receive output terminal being connected with an output terminal of the low-noise amplifier, and wherein with the module substrate seen in plan view, the metal shield plate is disposed between the first external connection terminal and the second external connection terminal.

20. A communication apparatus comprising:

a radio-frequency integrated circuit configured to process a radio-frequency signal transmitted and received by an antenna; and the radio-frequency module according to claim 1 configured to propagate the radio-frequency signal between the antenna and the radio-frequency integrated circuit.

\* \* \* \* \*